(12) United States Patent
Fujii

(10) Patent No.: US 7,126,191 B2
(45) Date of Patent: Oct. 24, 2006

(54) DOUBLE-DIFFUSED SEMICONDUCTOR DEVICE

(75) Inventor: Hiroki Fujii, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/958,732

(22) Filed: Oct. 6, 2004

(65) Prior Publication Data

US 2005/0082603 A1 Apr. 21, 2005

(30) Foreign Application Priority Data

Oct. 6, 2003 (JP) ............................. 2003-346493

(51) Int. Cl.
*H01L 29/94* (2006.01)
(52) U.S. Cl. ...................... 257/339; 257/335; 257/361; 257/362; 257/497; 257/342; 257/356
(58) Field of Classification Search ................ 257/361, 257/355, 362, 497, 335, 339, 356, 409, 492, 257/493, 342, E29.027, E29.066; 438/309
See application file for complete search history.

(56) References Cited

U.S. PATENT DOCUMENTS 6,909,143 B1 * 6/2005 Jeon et al. ................... 257/335

6,963,109 B1 * 11/2005 Kikuchi et al. .............. 257/335
2004/0108548 A1 * 6/2004 Cai ............................ 257/335
2005/0062102 A1 * 3/2005 Dudek et al. ............... 257/335

FOREIGN PATENT DOCUMENTS

JP          6-37266        10/1994

* cited by examiner

*Primary Examiner*—Eugene Lee
(74) *Attorney, Agent, or Firm*—Young & Thompson

(57) ABSTRACT

A DMOSFET and a method of fabricating the same, capable of keeping a desirable level of drain voltage resistance and, at the same time, of reducing the drain resistance. In a DMOSFET configured as having a drain region composed of an epitaxial layer formed on a P-type semiconductor substrate while placing an N-type buried layer in between, and as having, in the drain region, a P-type body region having an N-type source region nested therein and a drain extraction region, formation of N-type, heavily-doped buried layers prior to the epitaxial growth is proceeded so as not to form them at least in the region under the P-type body region, and so as to make an impurity concentration in the region under the P-type body region smaller than that in the region under a drift region when viewed after the impurity is diffused by the succeeding annealing.

9 Claims, 15 Drawing Sheets

PRIOR ART

DOUBLE-DIFFUSED SEMICONDUCTOR DEVICE

This application is based on Japanese patent application No. 2003-346493 the content of which is incorporated hereinto by reference.

BACKGROUND OF THE INVENTION

1. Field of the Invention

The present invention relates to a semiconductor device and a method of fabricating the same, and in particular to a double-diffused MOSFET and a method of fabricating the same.

2. Description of the Related Art

There is known a double-diffused MOSFET (referred to as DMOSFET, hereinafter) as a MOS transistor operable at a voltage around 100 V. As shown in FIG. 25, the DMOSFET has, as being formed over the entire surface of a P-type semiconductor substrate 1, an N-type buried layer 2 in which a diffused region 2b, an N-type, heavily-doped buried layer 2a and a diffused region 2b are stacked in this order, and has a drain region 7 formed by growing an epitaxial layer on the N-type buried layer 2. The drain region 7 has, as being formed therein, a drain extraction region 9 and a drain contact layer 12 containing an N-type impurity diffused therein, and a P-type body region 10 containing a P-type impurity diffused therein. The P-type body region 10 has an N-type source region 13 formed in the surficial portion thereof, and additionally has a P$^+$-type region 14 formed as being surrounded by the N-type source region 13. The region between the N-type source region 13 and the drain extraction region 9 has a drift region and a field oxide film 8, and also has a gate electrode 11 formed thereon so as to cover the drift region and a part of the field oxide film 8, while placing a gate insulating film in between.

The DMOSFET can be fabricated by a general diffusion process, and is used in combination with various MOSFETs by virtue of its convenience for IC manufacturing, because all terminals of which can be extracted from the top surface of the chip. For example, Patent Publication Laid-Open 1994-37266 discloses a structure of an integrated circuit in which a CMOSFET for logic circuit is hybridized with a high-voltage-resistance DMOSFET, and a method of fabricating the same.

In thus-configured DMOSFET, the drain resistance may be lowered by raising the impurity concentration in the N-type buried layer 2, but increase in the impurity concentration of the N-type buried layer 2 undesirably makes it more likely to cause punch-through between the source and drain, and fails in keeping a desirable level of the drain voltage resistance. A problem therefore remains in that any effort of keeping the drain voltage resistance at as high as 80 V or around results in only an insufficient reduction in the drain resistance, and consequently fails in obtaining transistors with desirable characteristics.

The impurity concentration of the N-type buried layer 2 might slightly be increased for the case where the DMOSFET is used as a device having a voltage resistance of as low as 20 to 40 V or around, and thereby the drain resistance might be reduced to some degree, but a problem arises even in this case in that the N-type impurity causes out-diffusion from the N-type buried layer 2 when the epitaxial layer is grown thereon, and causes auto-doping into the epitaxial layer.

SUMMARY OF THE INVENTION

It is therefore an object of the present invention to provide a semiconductor device and a method of fabricating the same, wherein one of major objects thereof is to provide a DMOSFET and a method of fabricating the same, capable of keeping a desirable level of drain voltage resistance and, at the same time, of reducing the drain resistance.

A DMOSFET of the present invention conceived in order to accomplish the foregoing object is a double-diffused MOSFET which comprises at least a first-conductive-type buried layer formed in a second-conductive-type semiconductor substrate; a drain region composed of an epitaxial layer formed on the first-conductive-type buried layer; a second-conductive-type body region and a first-conductive-type drain extraction region formed in the drain region; a first-conductive-type source region formed in the second-conductive-type body region; a gate electrode formed at least on a part of the region intermediated by a gate insulating film between the first-conductive-type source region and the first-conductive-type drain extraction region; and a drift region between the second-conductive-type body region and the first-conductive-type drain extraction region; wherein the first-conductive-type buried layer is formed so as to have a first-conductive-type impurity concentration thereof lower in the region under the second-conductive-type body region than in the region under the drift region.

In the present invention, the first-conductive-type buried layer can further be configured so as to have first-conductive-type, heavily-doped buried layers formed in portions of the second-conductive-type semiconductor substrate before growth of the epitaxial layer; and diffused regions formed by allowing an impurity from the first-conductive-type, heavily-doped buried layers, and having an impurity concentration lower than that of the first-conductive-type, heavily-doped buried layer, and so that only the diffused regions exist at least in a part of the region under the second-conductive-type body region.

In the present invention, the first-conductive-type, heavily-doped buried layers can be configured as being connected by the diffused regions in the region under the second-conductive-type body region, or the diffused regions can be configured as being isolated, in the region under the second-conductive-type body region, by a region having an impurity concentration further lower than that of the diffused regions.

A method of fabricating a double-diffused MOSFET of the present invention comprises at least the steps of forming first-conductive-type, heavily-doped buried layers in the surficial portion of a second-conductive-type semiconductor substrate; forming a drain region composed of an epitaxial layer on the first-conductive-type, heavily-doped buried layers; forming a second-conductive-type body region in the drain region by implanting therein a second-conductive-type impurity; forming a first-conductive-type drain extraction region in the drain region by implanting therein a first-conductive-type impurity; forming a first-conductive-type source region in the second-conductive-type body region by implanting therein a first-conductive-type impurity; and forming a gate electrode at least on a part of the region between the first-conductive-type source region and the first-conductive-type drain extraction region while placing a gate insulating film in between; wherein the first-conductive-type, heavily-doped buried layers are formed in regions except at least a part of the region under the second-conductive-type body region.

Another method of fabricating a double-diffused MOSFET of the present invention comprises at least the steps of forming first-conductive-type, heavily-doped buried layers in the surficial portion of a second-conductive-type semiconductor substrate; forming a second-conductive-type epitaxial layer on the first-conductive-type, heavily-doped buried layers; implanting a first-conductive-type impurity into the second-conductive-type epitaxial layer; forming a drain region in the second-conductive-type epitaxial layer by allowing the first-conductive-type impurity to diffuse therein by annealing, and at the same time, forming diffused regions, having an impurity concentration lower than that of the first-conductive-type, heavily-doped buried layers, around the first-conductive-type, heavily-doped buried layers, by allowing a first-conductive-type impurity to diffuse from the first-conductive-type, heavily-doped buried layers; forming a second-conductive-type body region in the drain region by implanting therein a second-conductive-type impurity; forming a first-conductive-type drain extraction region in the drain region by implanting therein a first-conductive-type impurity; forming a first-conductive-type source region in the second-conductive-type body region by implanting therein a first-conductive-type impurity; and forming a gate electrode at least on a part of the region between the first-conductive-type source region and the first-conductive-type drain extraction region while placing a gate insulating film in between; wherein the first-conductive-type, heavily-doped buried layers are formed in regions except at least a part of the region under the second-conductive-type body region.

In the present invention, the method can be configured so as to carry out the annealing at a temperature or for a duration of time, by which the region having no first-conductive-type, heavily-doped buried layer formed therein is filled with the diffused regions.

As is obvious from the above, by growing, prior to the epitaxial growth, the first-conductive-type buried layers so as not to be formed in at least in the region under the second-conductive-type body region, rather than by growing it over the entire surface of the DMOSFET, and by making the impurity concentration in the region under the second-conductive-type body region smaller than that in the region under a drift region when viewed after the impurity is diffused by the succeeding annealing, it is made possible for the present invention to successfully suppress punch-through between the source and drain, to thereby keep a high level of drain voltage resistance. Increase in the first-conductive-type impurity concentration in the region under the drift region is also successful in lowering the drain resistance.

The method of fabricating a DMOSFET of the present takes effects described as follows.

A first effect of the present invention resides in that it is successful in suppressing reduction in the drain voltage resistance.

This is because the first-conductive-type, heavily-doped buried layer is formed, prior to the epitaxial growth, in regions except at least a part of the region under the second-conductive-type body region, and so that the impurity concentration in the region under the second-conductive-type body region can be made smaller than that in the region under a drift region when viewed after the impurity is diffused by the succeeding annealing, and this makes it possible to moderate a potential slope between the source region and the first-conductive-type buried layer to thereby make the punch-through less likely to occur, and makes it possible to suppress the drain resistance.

A second effect of the present invention resides in that it is successful in lowering the drain resistance.

This is because the first-conductive-type, heavily-doped buried layer is not formed in the region under the second-conductive-type body region, and this is consequently successful in raising the impurity concentration of the N-type buried layer in the region under the drift region.

DETAILED DESCRIPTION OF THE INVENTION

As described above in the Related Art, DMOSFET is generally used in a voltage range relatively as small as 100 V or below. The DMOSFET has the N-type buried layer formed therein, and it is necessary to increase the impurity concentration of the N-type buried layer for the purpose of reducing the drain resistance. The increase in the impurity concentration of the N-type buried layer, however, makes punch-through between the source and drain more likely to occur, and thereby the drain voltage resistance tends to degrade. In other words, reduction in the drain resistance and keeping a desirable level of the drain voltage resistance are contradictory to each other in the conventional configuration, and it has been believed that both of which cannot not be satisfied at the same time.

The N-type (as a first-conductive-type) buried layer herein is provided in order to isolate the substrate and P-type (as a second-conductive-type) body region, wherein it is not always necessary for the layer to have a uniform concentration so far as the N-type impurity is buried. Therefore in the process of forming the N-type, heavily-doped buried layer prior to the epitaxial growth in the present invention, a region in which the N-type, heavily-doped buried layer is not formed is secured in at least a part of the region under the P-type body region, so that the impurity concentration in the region under the P-type body region becomes smaller than that in the region under a drift region when viewed after the impurity is diffused by the succeeding annealing. This configuration makes it possible to successfully suppress punch-through between the source and drain, and thereby to suppress lowering in the drain voltage resistance. Increase in the N-type impurity concentration in the region under the drift region is also successful in lowering the drain resistance.

First Embodiment

Figure 1:
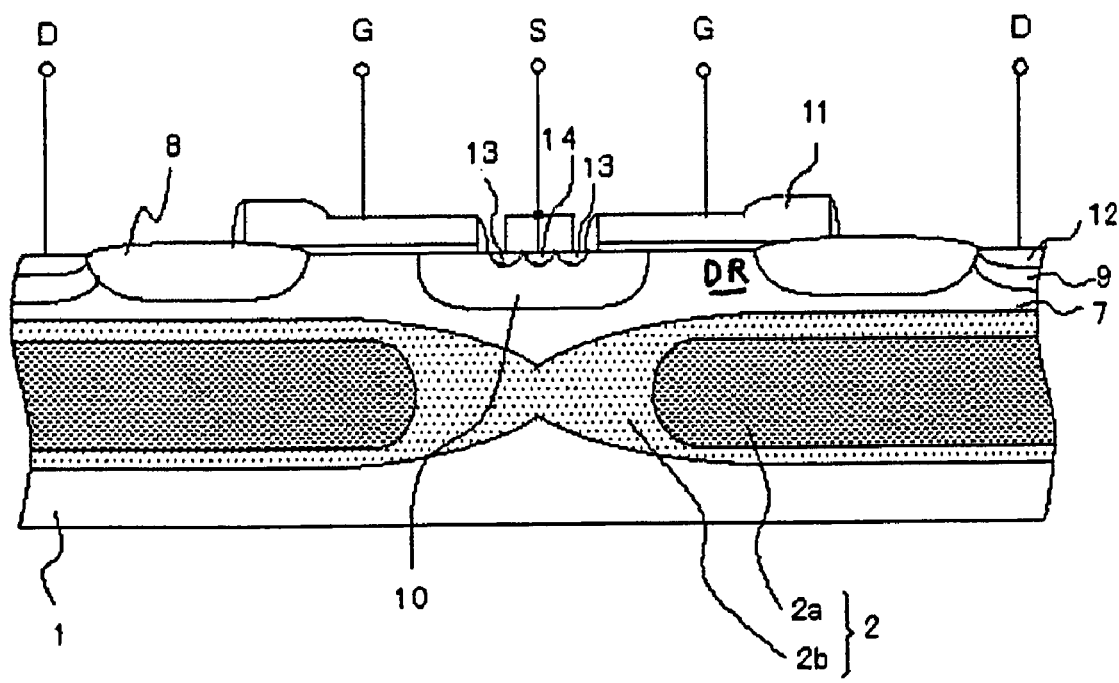
FIG. 1 is a sectional view showing a structure of a mode of embodiment of a DMOSFET of the present invention.

To further detail the aforementioned present invention, a DMOSFET and a method of fabricating the same according to a first mode of embodiment of the present invention will be described below, referring to FIG. 1 to FIG. 16B. FIG. 1 is a drawing showing a structure of the DMOSFET of the present invention, FIGS. 2A to 3B are drawings showing a profile of the N-type buried layer in the DMOSFET according to this mode of embodiment, FIGS. 4 to 12 are sectional views showing process steps of the method of fabricating the DMOSFET according to this mode of embodiment, and FIGS. 13 to 16B are drawings showing effects of the DMOSFET of the this mode of embodiment.

As shown in FIG. 1, the DMOSFET of this mode of embodiment has an N-type buried layer 2, formed on a P-type semiconductor substrate 1, of which impurity concentration varied in the in-plane direction of the substrate, and has a drain region 7 composed of an epitaxial layer formed on the N-type buried layer 2. The drain region 7 has, as being formed therein, a P-type body region 10 formed by implanting a P-type impurity, and as being formed in a region thereof isolated by a field oxide film 8, a drain extraction region 9 and a drain contact layer 12 formed by implanting an N-type impurity. The P-type body region 10 has, in the surficial portion thereof, an N-type source region 13, and a $P^+$-type region 14 formed as being positioned between the N-type source regions 13 at the section. A drift region DR is formed in the region between the P-type body region 10 and the drain extraction region 9, and a gate electrode 11 (on a gate insulating film) is formed so as to cover at least part of the region between the N-type source region 13 and the drain extraction region 9.

The N-type buried layer 2 comprises an N-type, heavily-doped buried layers 2a formed, prior to growth of the epitaxial layer, in regions except at least a part of the region under the P-type body region 10, and a diffused region 2b having therein an N-type impurity diffused by the succeeding annealing (e.g., a process step of diffusing an N-type impurity into the P-type epitaxial layer, and a process step of forming a field oxide film), and having an impurity concentration lower than that of the N-type, heavily-doped buried layers 2a, wherein only the diffused region 2b having a smaller impurity concentration is disposed in the region under the P-type body region 10. It is to be noted that although a region having a higher impurity concentration formed prior to the epitaxial growth (any regions having an impurity concentration equivalent to that in this region also included) is referred to as the N-type, heavily-doped buried layer 2a, and a region obtained after the diffusion by the annealing is referred to as the buried layer diffused region 2b in this mode of embodiment, this way of classification is merely as a matter of convenience, and both of them cannot be discriminated from each other so clearly as being illustrated in the drawing.

Figure 2A:
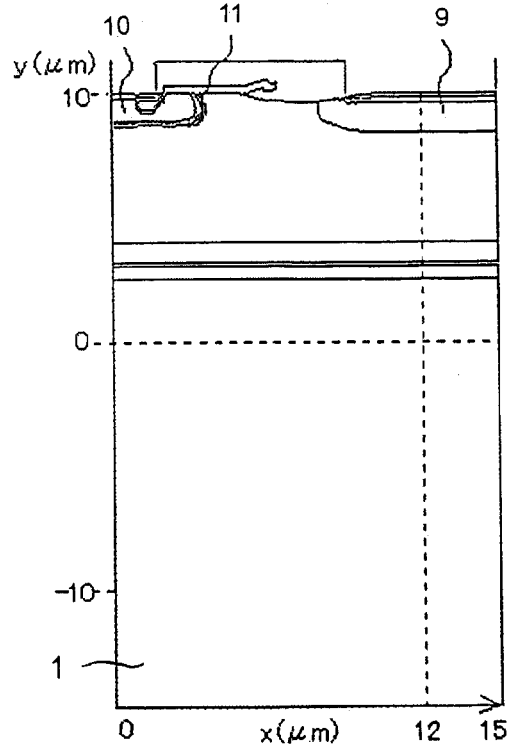
FIGS. 2A and 2B show conventional structures and FIG. 2C shows the N-type buried layer in the DMOSFET according to the first mode of embodiment of the present invention.
Figure 2B:
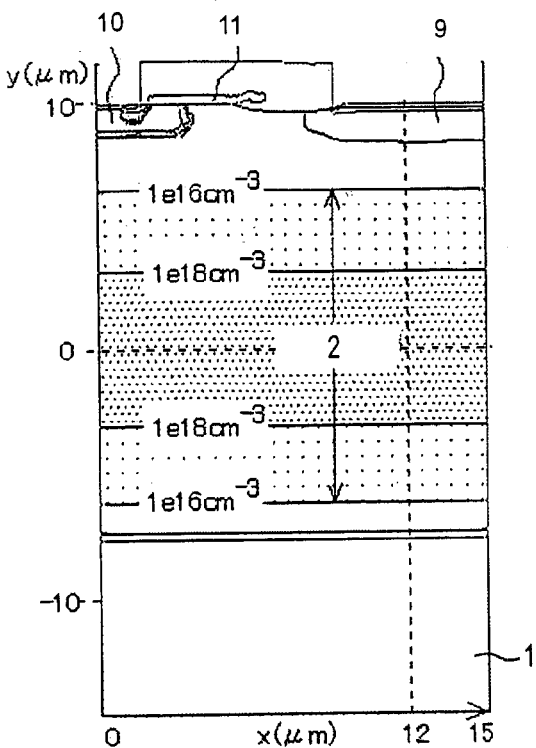
Figure 2C:
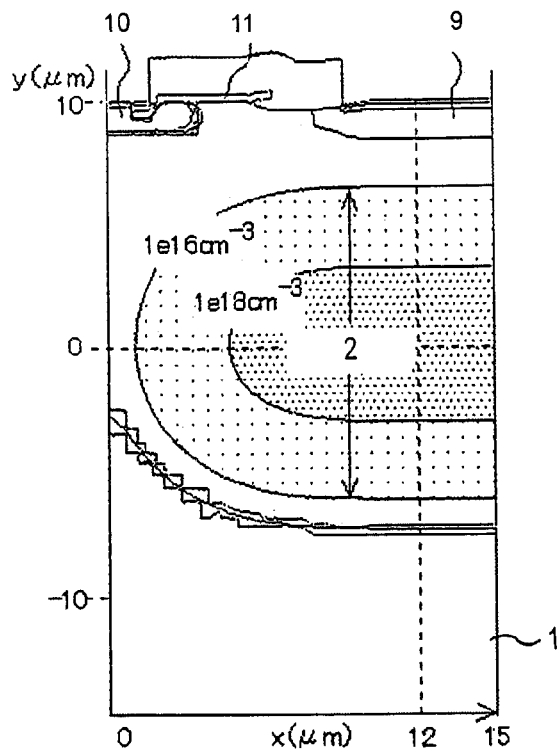
Figure 3A:
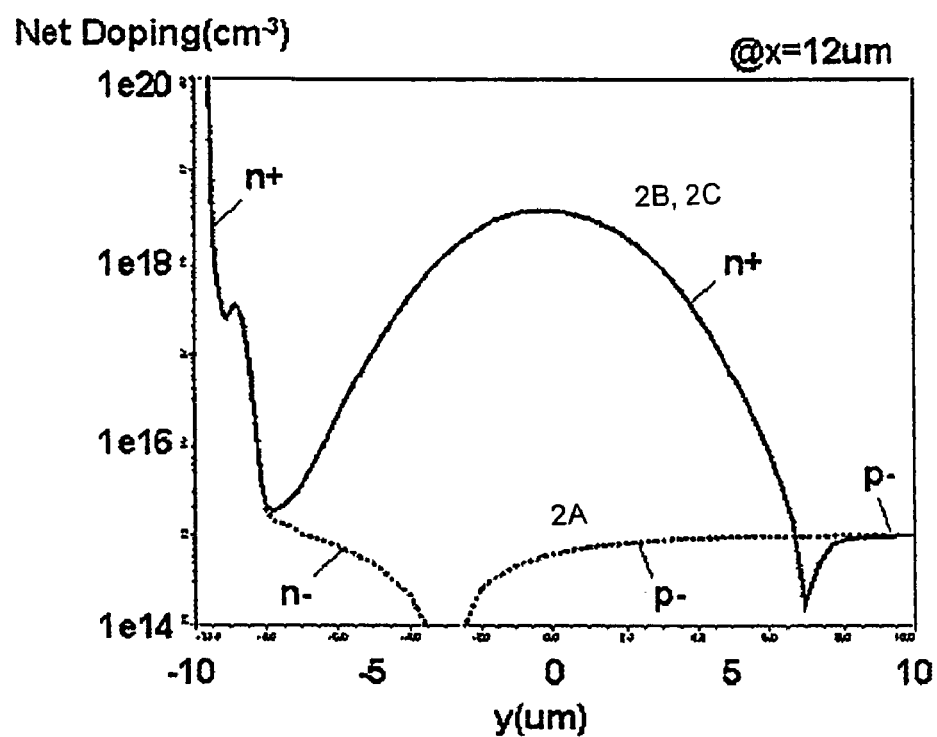
FIGS. 3A and 3B are drawings respectively showing a depth profile and an in-plane profile of the N-type buried layer in the DMOSFET according to the first mode of embodiment of the present invention.
Figure 3B:
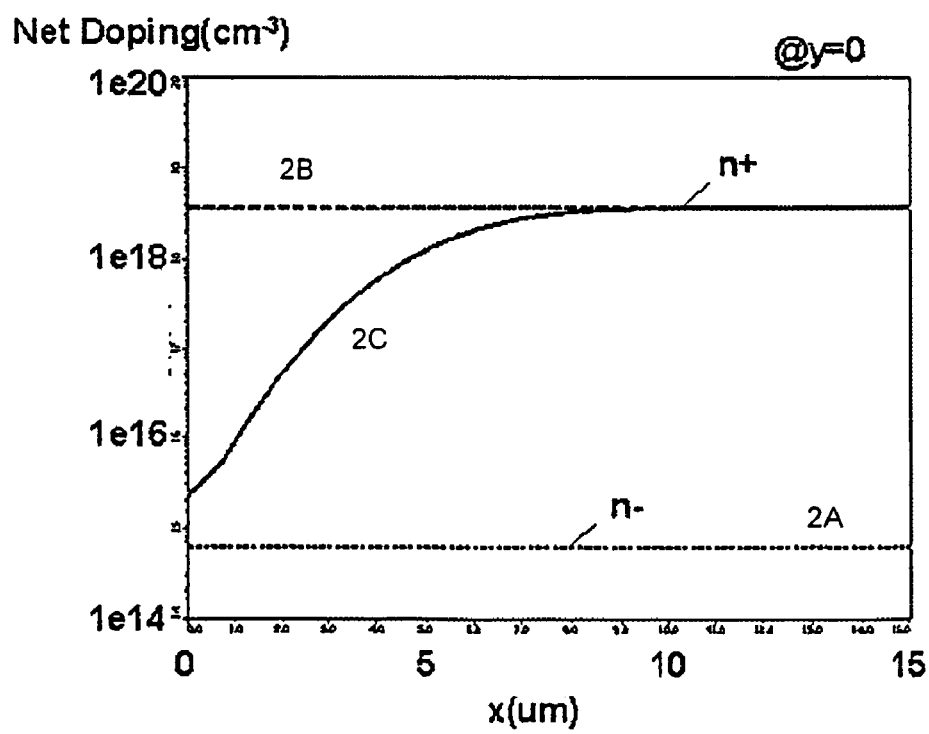

Results of simulation on concentration profiles of the N-type impurity in the N-type buried layer 2 is shown in FIGS. 2A to 2C, and FIGS. 3A, 3B. FIGS. 2A to 2C are drawings showing a geometry of the N-type buried layer 2, FIG. 3A shows a depth profile of the impurity concentration at position x=12 µm in FIGS. 2A to 2C, and FIG. 3B shows a in-plane profile of the impurity concentration at position y=0. FIG. 2A is a sectional view showing a structure having no N-type buried layer 2 (a first conventional structure), FIG. 2B is a sectional view showing a structure having the N-type buried layer 2 formed over the entire surface of the DMOSFET (a second conventional structure), and FIG. 2C is a sectional view showing a structure of this mode of embodiment, in which the N-type, heavily-doped buried layers 2a are formed in regions except at least a part of the region under the P-type body region 10, that is, in which the N-type buried layer 2 has the impurity concentration varied therein. In FIGS. 3A, 3B, curve 2A expresses the profile shown in FIG. 2A, curve 2B expressed the profile shown in FIG. 2B, and curve 2C expresses the profile shown in FIG. 2C.

As shown in FIG. 2B, the second conventional structure, in which the N-type, heavily-doped buried layer is formed over the entire surface of the DMOSFET, has a region having a high impurity concentration (a region having a concentration of 1e18 ($1 \times 10^{18}$ is expressed like this, the same will apply hereinafter.) $cm^{-3}$ or around, but not identical to the N-type, heavily-doped buried layers 2a shown in FIG. 1.) formed over the entire surface, whereas the structure of this mode of embodiment shown in FIG. 2C has no heavily-doped region right under the P-type body region 10, and instead only a lightly-doped region (a region having a concentration of 1e16 $cm^{-3}$ or around, but not identical to the diffused region 2b shown in FIG. 1.), obtained by annealing for diffusion, resides therein. It is also found from FIG. 3A that the depth profiles of the impurity concentrations in the second conventional structure shown in FIG. 2B and in this mode of embodiment shown in FIG. 2C are identical, whereas, as shown in FIG. 3B, the in-plane profile of the impurity concentration in the structure of this mode of embodiment is found to gradually decrease towards the P-type body region 10 side (left hand side of the drawing). It is to be understood herein that all structures shown in FIG. 1 to FIG. 3B are none other than exemplary cases, wherein position of formation of the N-type, heavily-doped buried layers 2a and degree of spreading of the diffused region 2b are not limited to those illustrated in the drawings, so far as the concentration (average concentration) in the N-type buried layer 2 in the region under the P-type body region 10 is lower than that in the region under the drift region.

Figure 4:
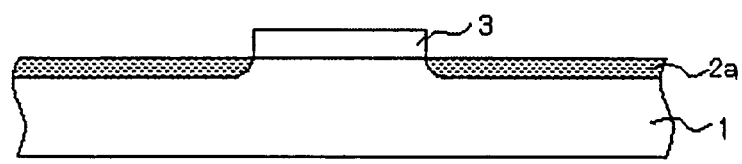
FIG. 4 is a sectional view showing a process step of the method of fabricating the DMOSFET according to the first mode of embodiment of the present invention.

Thus-configured DMOSFET can be fabricated by a method described as follows. First, as shown in FIG. 4, the N-type, heavily-doped buried layers 2a are formed in the surficial portion of the P-type semiconductor substrate 1. In this process of this mode of embodiment, a mask 3 typically composed of a silicon oxide film is formed so as to cover at least a part of a region in which the P-type body region 10, described later, will be formed, in order to make the impurity concentration of the N-type buried layer 2 lower in the region under the later-described P-type body region 10 than in the region under the later-described drift region. An N-type impurity such as arsenic (As), for example, is then implanted by the ion implantation process, typically under conditions of an implantation energy of 50 to 100 keV, and a dose of 5e14 to 5e15 $cm^{-2}$. It is to be noted that the region in which the mask 3 is formed can be determined taking a possible spreading of the diffused region 2b in the succeeding process steps into consideration, wherein the mask 3 and the P-type body region 10 herein are set to nearly equal dimension.

Figure 5:
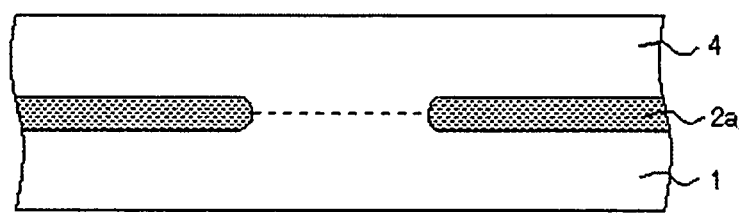
FIG. 5 is a sectional view showing a process step of the method of fabricating the DMOSFET according to the first mode of embodiment of the present invention.

Then, as shown in FIG. 5, the P-type epitaxial layer 4 of approximately 6 to 10 µm thick is formed at a temperature around 1,100 to 1,150 degrees centigrade by the CVD process. A problem may arise, during the growth of the P-type epitaxial layer 4, in that the N-type impurity causes out-diffusion from the N-type, heavily-doped buried layers 2a, and is doped into the P-type epitaxial layer 4 (auto-doping). On the contrary, the DMOSFET of this mode of embodiment has only a smaller area of formation of the N-type, heavily-doped buried layers 2a as compared with that in the conventional structure, and this is advantageous in obtaining an effect of reducing the out-diffusion or auto-doping.

Figure 6:
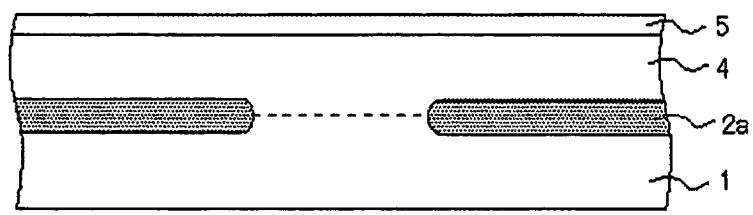
FIG. 6 is a sectional view showing a process step of the method of fabricating the DMOSFET according to the first mode of embodiment of the present invention.

Next, as shown in FIG. 6, an N-type impurity such as phosphorus (P) is implanted by the ion implantation process under conditions of an implantation energy of 50 to 100 keV and a dose of 5e11 to 5e12 $cm^{-2}$, to thereby form an N-type impurity implanted layer 5 in the surficial portion of the P-type epitaxial layer 4.

Figure 7:
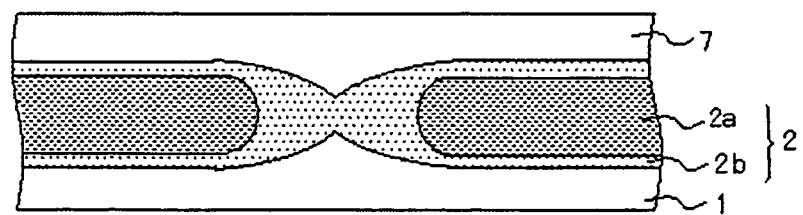
FIG. 7 is a sectional view showing a process step of the method of fabricating the DMOSFET according to the first mode of embodiment of the present invention.

Thereafter, as shown in FIG. 7, the P-type semiconductor substrate 1 is annealed at a temperature around 1,100 to 1,200 degrees centigrade for 3 to 11 hours or around, so as to embed P (allow P to diffuse) into the P-type epitaxial layer 4, to thereby form the drain region 7. During the annealing, As contained in the N-type, heavily-doped buried layers 2a shown on the left hand side and right hand side of the drawing causes diffusion, to thereby form the region (diffused region 2b) having an impurity concentration lower than that of the N-type, heavily-doped buried layers 2a. Degree of spreading of the diffused region 2b varies depending on the annealing temperature, so that it is preferable to adjust the annealing temperature so that the N-type, heavily-doped buried layers 2a on both sides can be connected by the diffused region 2b, in order to certainly isolate the P-type semiconductor substrate 1 from the drain region 7. It is to be noted herein that also in any other annealing processes (e.g., growth process of the epitaxial layer, and succeeding formation process of the field oxide film) besides the above-described annealing process, the N-type impurity can diffuse from the N-type, heavily-doped buried layers 2a to thereby form the diffused region 2b, but no explanation nor illustration will be made because degree of the diffusion is small. It is to be noted also that the N-type, heavily-doped buried layers 2a shown in FIG. 7 are different from the N-type, heavily-doped buried layers 2a shown in FIG. 4 in a strict sense, but they are understood herein as being identical because they are regions having an equivalent impurity concentration. The N-type, heavily-doped buried layers 2a and the diffused region 2b compose the N-type buried layer 2.

Figure 8:
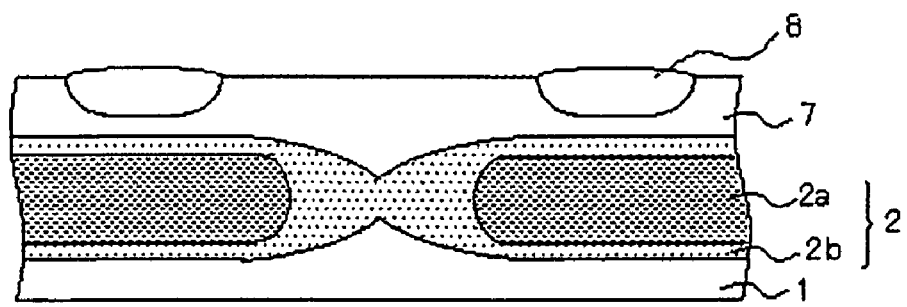
FIG. 8 is a sectional view showing a process step of the method of fabricating the DMOSFET according to the first mode of embodiment of the present invention.

Then, as shown in FIG. 8, annealing is carried out typically by the LOCOS process, typically under a temperature condition of 1,000 to 1,200° C. or around, to thereby form the field oxide film 8 of approximately 0.3 to 0.5 µm thick.

Figure 9:
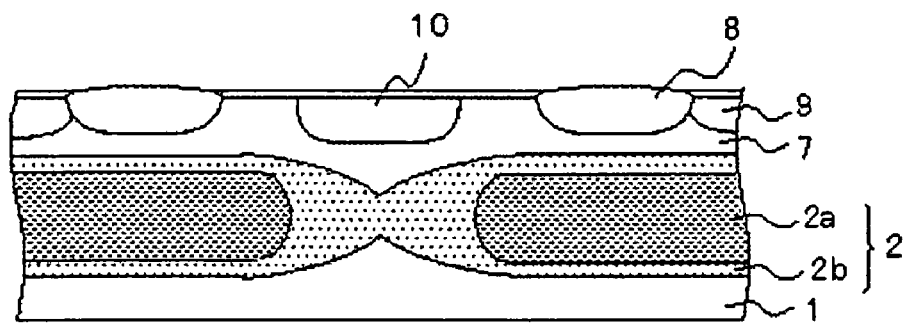
FIG. 9 is a sectional view showing a process step of the method of fabricating the DMOSFET according to the first mode of embodiment of the present invention.

Next, a mask (not shown) is formed so that only a target region for formation of the P-type body region 10 is exposed, a P-type impurity such as boron (B) is implanted by ion implantation process under conditions of an implantation energy of 200 to 300 keV and a dose of 2 to 3e12 $cm^{-2}$, which is followed by an implantation under an implantation energy of 100 to 150 keV and a dose of 2 to 3e12 $cm^{-2}$, and is further followed by an implantation under an implantation energy of 20 to 50 keV and a dose of 2 to 3e12 $cm^{-2}$, to thereby form the P-type body region 10, as shown in FIG. 9. The reason why the ion implantation is carried out as being divided into a plurality of numbers of steps as described in the above is to exactly control the impurity concentration in the P-type body region 10. Thereafter, a mask (not shown) is formed so that only a target region for formation of the drain extraction region 9 is exposed, an N-type impurity such as phosphorus (P) is implanted by ion implantation process under conditions of an implantation energy of 200 to 300 keV and a dose of 2 to 3e12 $cm^{-2}$, to thereby form the drain extraction region 9.

Figure 10:
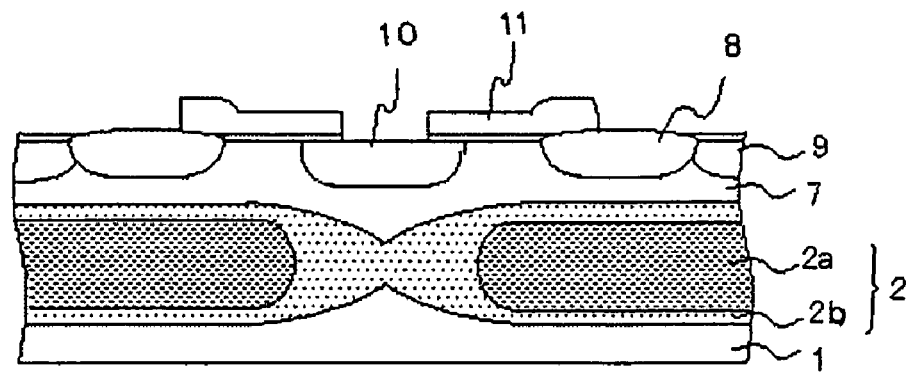
FIG. 10 is a sectional view showing a process step of the method of fabricating the DMOSFET according to the first mode of embodiment of the present invention.

Next, a gate insulating film typically composed of a silicon oxide film is formed over the entire surface, a polysilicon film is then deposited over the entire surface of the substrate to a thickness of 150 to 300 nm or around, and the polysilicon film is then selectively etched to thereby form the gate electrode 11 which covers at least a part of the drift region (a region ranging from the outer peripheral portion in the P-type body region 10 to the field oxide film 8 herein), as shown in FIG. 10.

Figure 11:
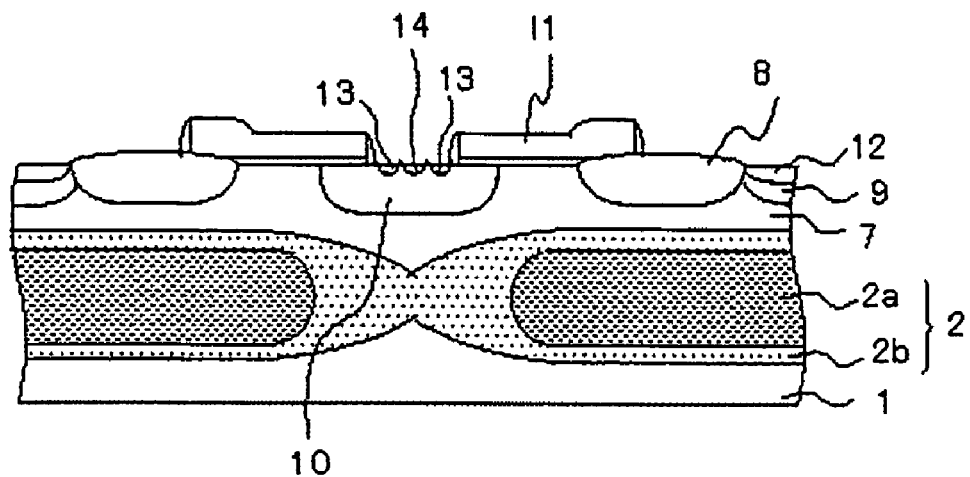
FIG. 11 is a sectional view showing a process step of the method of fabricating the DMOSFET according to the first mode of embodiment of the present invention.

Then, as shown in FIG. 11, sidewalls are formed on both side faces of the gate electrode 11, an N-type impurity such as As is implanted by the ion implantation process under conditions of an implantation energy of 30 to 70 keV and a dose of 1 to 5e15 $cm^{-2}$, to thereby form the N-type source region 13 in the P-type body region 10, and at the same time to thereby form the drain contact layer 12 for establishing contact with the drain extraction region 9. Next, a P-type impurity such as $BF_2$ is implanted under an implantation energy of 30 to 70 keV and a dose of 1 to 5e15 $cm^{-2}$, to thereby form the $P^+$-type region 14 as being positioned between the N-type source regions 13.

Figure 12:
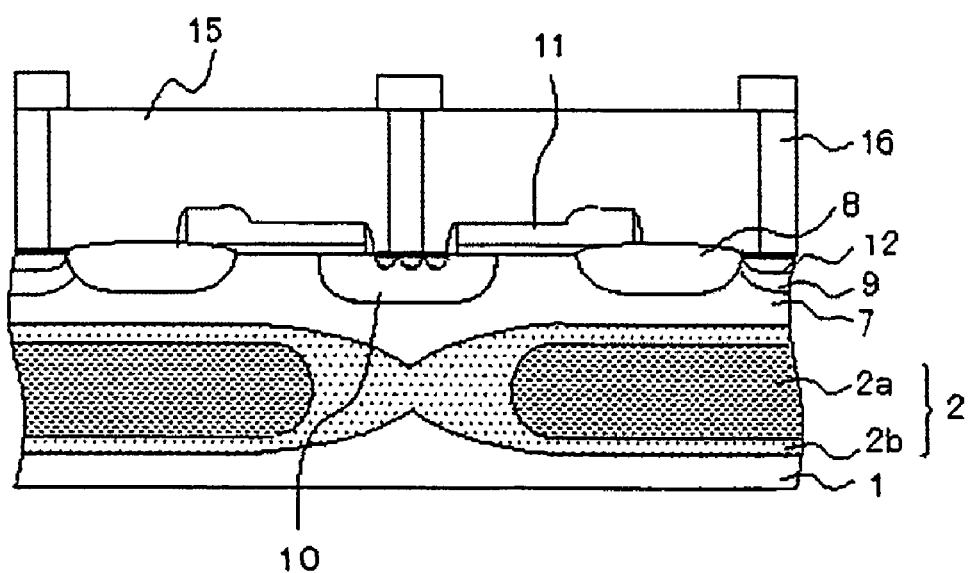
FIG. 12 is a sectional view showing a process step of the method of fabricating the DMOSFET according to the first mode of embodiment of the present invention.

Thereafter, as shown in FIG. 12, an interlayer insulating film 15 is deposited thereon, and via-holes are then formed by a publicly-known method so as to penetrate the interlayer insulating film 15, and so as to contact with the N-type source region 13, drain contact layer 12 and gate electrode 11. The via-holes are then filled with a metal to thereby form via-plugs 16, and wirings connected to the via-plugs 16 are then formed, to thereby complete a basic structure of the DMOSFET of this mode of embodiment. In this state, the N-type, heavily-doped buried layers 2a having an impurity concentration of 1e18 $cm^{-3}$ or more has a thickness of approximately 4 to 7 μm in the depth-wise direction.

Figure 13:
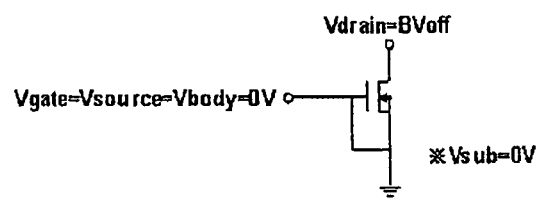
FIG. 13 is an equivalent circuit for a simulation evaluating an effect of DMOSFET.

Now, FIG. 13 is an equivalent circuit for the following simulations.

Figure 14A:
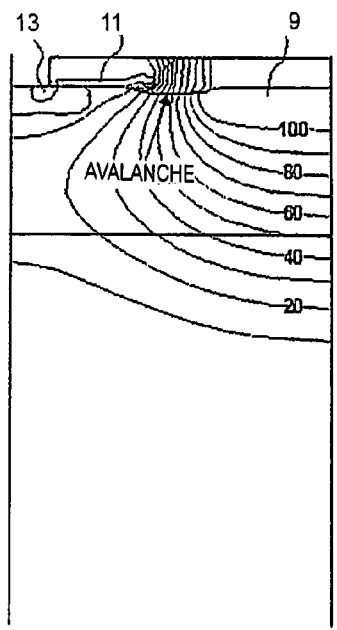
FIGS. 14A to 14C are drawings showing an effect (drain resistance) of the DMOSFET of the this mode of embodiment.
Figure 14B:
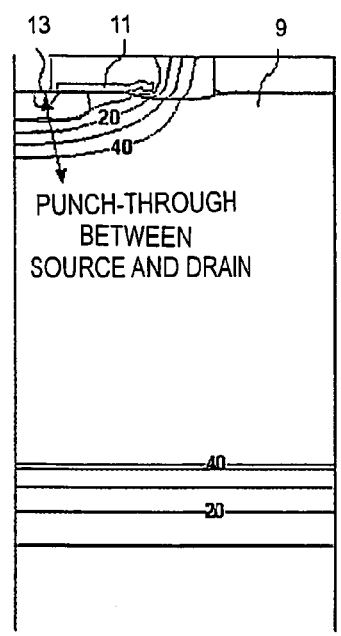
Figure 14C:
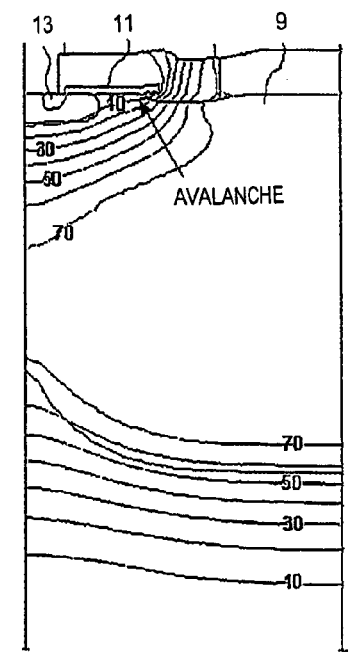

In order to confirm effects of thus-fabricated DMOSFET, a simulation was respectively made on the first conventional structure shown in FIG. 14A having no N-type buried layer, the second conventional structure shown in FIG. 14B having the N-type buried layer formed over the entire surface, and the structure shown in FIG. 14C in which the N-type buried layer 2 has a lower impurity concentration in the region under the P-type body region 10, wherein potential distribution when brake-down occurs after gradually raising the drain voltage, while keeping the gate potential, source potential and substrate potential at 0 V, was calculated. (Numerals in the drawings indicate potential (V) of equipotential lines.) It is known from FIG. 14A that the first conventional structure allows the breakdown to cause when the drain potential is raised to as high as 100 V or around, due to avalanche breakdown in the surficial portion of the substrate. On the other hand, in the second conventional structure shown in FIG. 14B, potential slope in the depth-wise direction of the substrate becomes sharp due to the N-type buried layer 2 formed over the entire surface, wherein the punch-through between the source and drain will be more likely to occur, even at a drain voltage of as low as 40 V or around. In contrast to this, it is found from the structure of this mode of embodiment shown in FIG. 14C in which the N-type buried layer 2 has a lower impurity concentration in the region under the P-type body region 10, that the potential slope in the P-type body region 10 in the depth-wise direction of the substrate is moderated by virtue of the reduced impurity concentration of the N-type buried layer 2 in the region under the P-type body region 10, and this makes the punch-through less likely to occur, and makes it possible to maintain the drain voltage resistance at as high as 70 V or around.

Figure 15A:
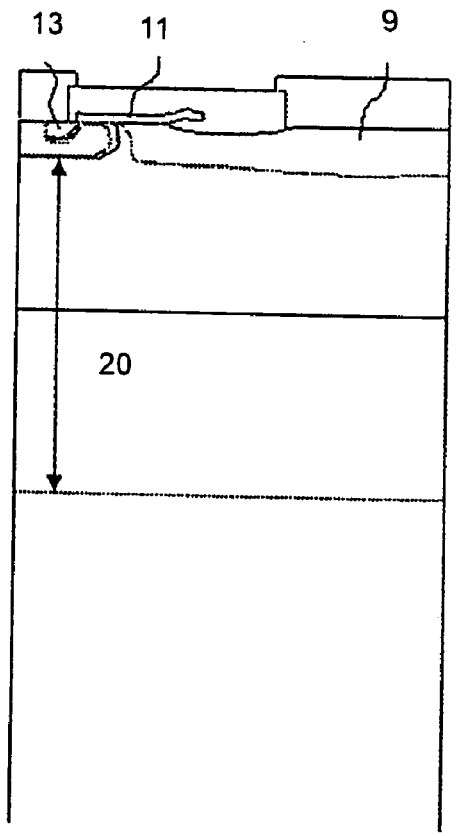
FIGS. 15A to 15C are drawings showing an effect (state of depletion layer) of the DMOSFET of the this mode of embodiment.
Figure 15A:
Figure 15A:
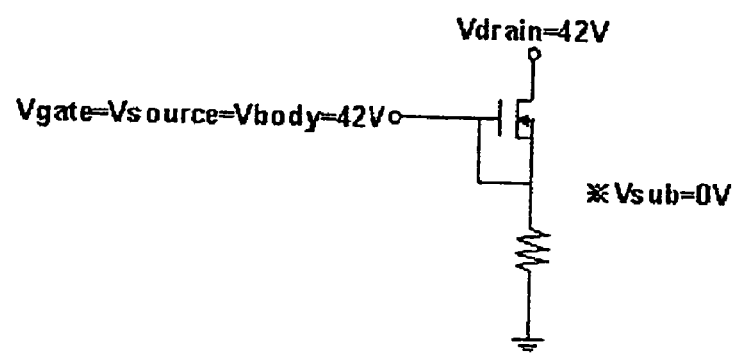
Figure 15B:
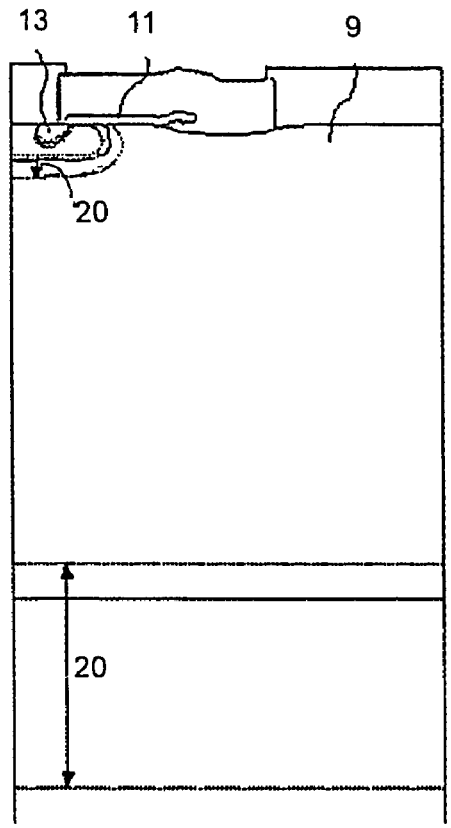
Figure 15B:
Figure 15B:
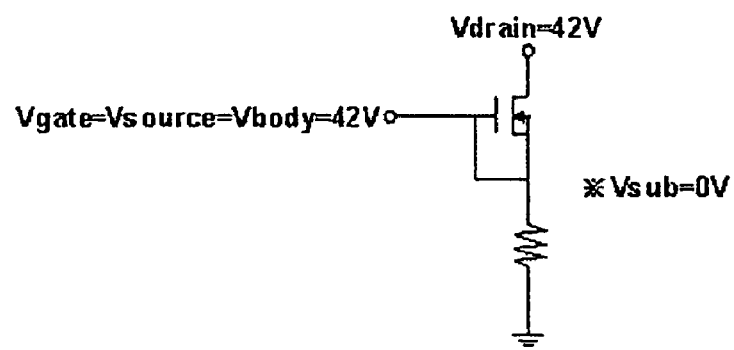
Figure 15C:
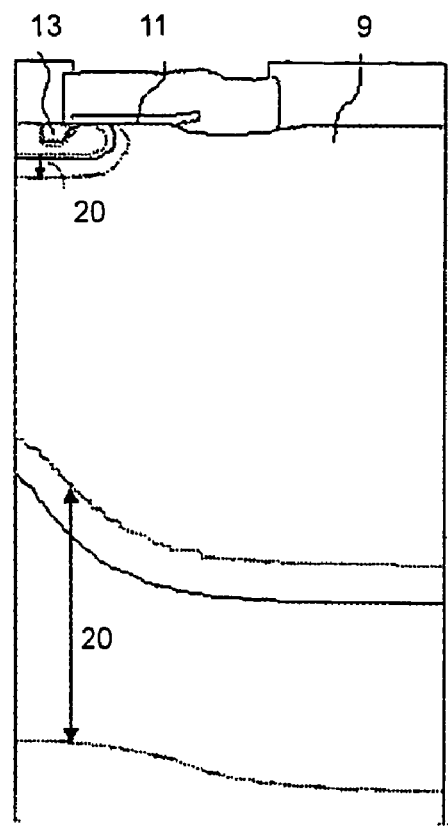
Figure 15C:
Figure 15C:
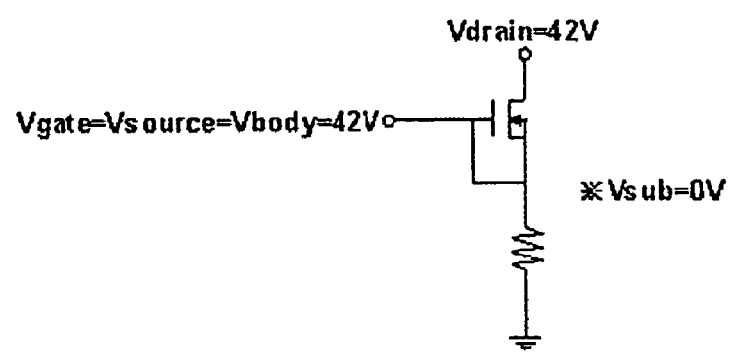

Next, states of the depletion layer, as shown in FIG. 15A to FIG. 15C, were calculated by simulation assuming that all of the gate potential, source potential and body potential are equal to the drain potential (42 V). It is known from FIG. 15A that the first conventional structure results in formation of the depletion layer in the vicinity of the surficial portion of the substrate, and this prevents the ON current from increasing, whereas the second conventional structure having the N-type buried layer formed therein as shown in FIG. 15B, and the structure of this mode of embodiment shown in FIG. 15C result in formation of the depletion layer 20 deep inside the substrate, and this widens the drain region and makes it possible to increase the ON current.

Figure 16A:
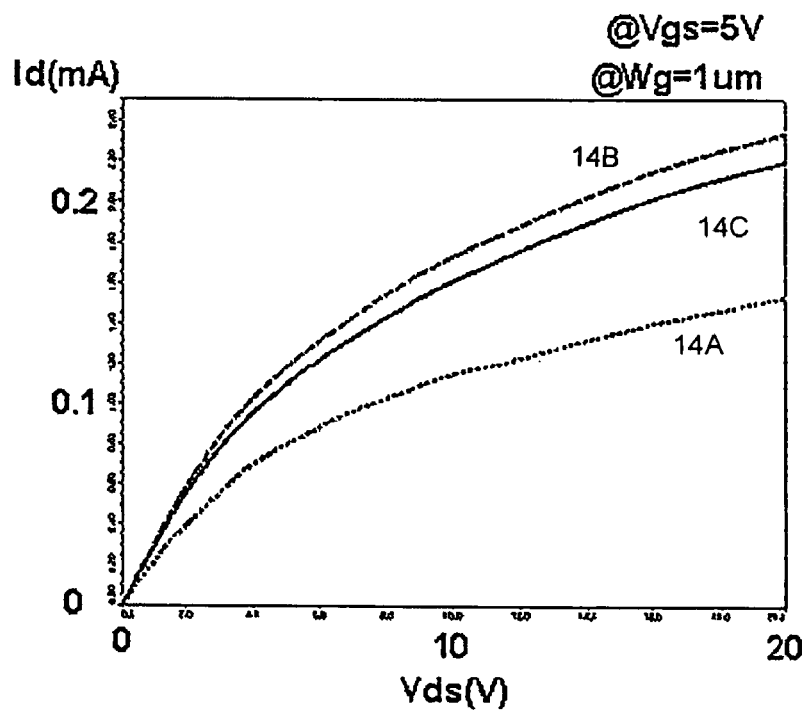
FIGS. 16A and 16B are drawings showing an effect (I–V characteristic) of the DMOSFET of the this mode of embodiment.
Figure 16B:
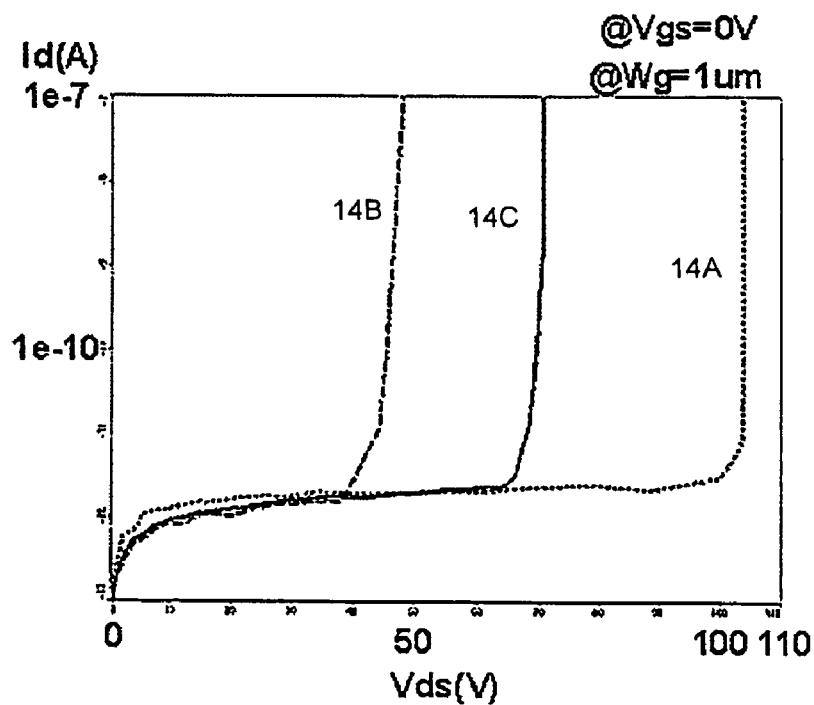

Next, I–V characteristics of three above-described structures, as shown in FIGS. 16A and 16B, were calculated by simulation assuming the gate width as 1 μm. It is known from FIG. 16A that the first conventional structure shown in FIG. 15A shows only a small slope of the I–V curve (15A) obtained under an applied gate voltage of 5 V, and causes only a small ON current, whereas it is known that the second conventional structure shown in FIG. 15B and the structure of this mode of embodiment shown in FIG. 15C make it possible to reduce the drain resistance as indicated by the I–V curves 15B, 15C, by virtue of the provision of the N-type buried layer 2, and that the ON current is increased. It is also known from the curves 15A to 15C shown in FIG. 16B that the first conventional structure shown in FIG. 15A has a voltage resistance of 100 V or around under a gate potential adjusted to 0 V, whereas the second conventional structure shown in FIG. 15B has a voltage resistance reduced to as low as approximately 40 V, because the punch-through between the source and drain becomes more likely to occur. In contrast to this, it is found that the structure of this mode of embodiment shown in FIG. 15C, in which the N-type buried layer 2 is provided, has a voltage resistance lower than that of the first conventional structure shown in FIG. 15A, but is successful in suppressing decrease in the voltage resistance by lowering the impurity concentration of the N-type buried layer 2 in the portion under the P-type body region 10, and is successful in maintaining the drain voltage resistance at as high as 70V or around.

From the above-described results of the simulation, it is known that the first conventional structure (FIG. 15A) having no N-type buried layer 2 results in formation of the depletion layer 20 in the vicinity of the surficial portion of the substrate, and this prevents the ON current from increasing. On the other hand, the second conventional structure (FIG. 15B) having the N-type buried layer 2 formed over the entire surface has a sharp potential slope in the depth-wise direction of the substrate, and becomes more likely to cause the punch-through, so that it is not possible to increase the drain voltage resistance. In contrast to this, the structure of this mode of embodiment (FIG. 15C) is successful in suppressing reduction in the drain voltage resistance by reducing the drain resistance by virtue of the N-type buried layer 2, and at the same time by lowering the impurity concentration in the region under the P-type body region 10. This made it possible to achieve both of reduction in the drain resistance and maintenance of a desirable level of drain voltage resistance at the same time, which had been believed as contradictory to each other.

Second Embodiment

Figure 24:
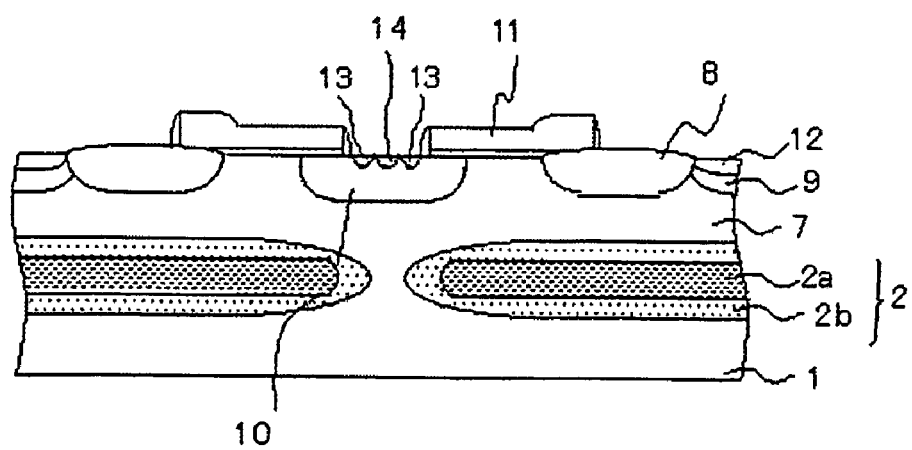
FIG. 24 is a sectional view showing a structure of the DMOSFET according to the second mode of embodiment of the present invention.
Figure 25:
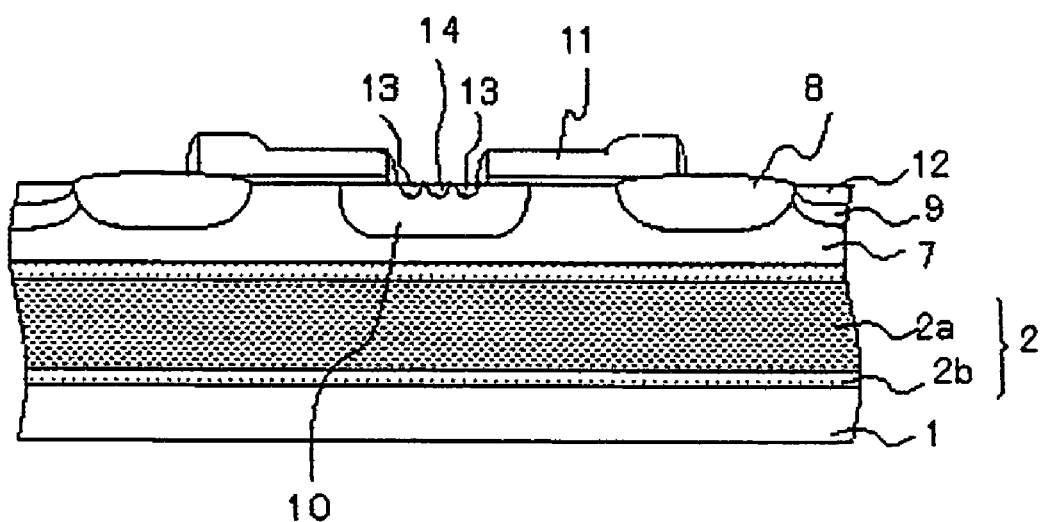
FIG. 25 is a sectional view showing a structure of a conventional DMOSFET.

A DMOSFET and a method of fabricating the same according to a second embodiment of the present invention will be described below, referring to FIGS. 17 to 24. FIGS. 17 to 23 are sectional views showing process steps of the method of fabricating the DMOSFET according to the second embodiment, and FIG. 24 is a sectional view showing a structure of the DMOSFET according to the second embodiment. Although in the aforementioned first embodiment, the P-type epitaxial layer 4 is grown, and the drain region 7 is then formed by embedding the N-type impurity into the P-type epitaxial layer 4, it is also possible to form the N-type epitaxial layer directly on the N-type, heavily-doped buried layers 2a. Based on the idea, a method of fabrication in this case will be explained in the second embodiment, referring to FIGS. 17 to 23.

Figure 17:
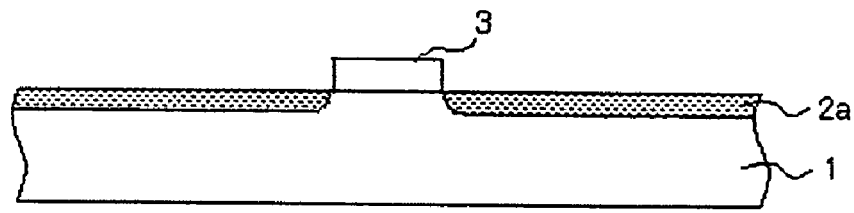
FIG. 17 is a sectional view showing a process step of the method of fabricating the DMOSFET according to the second mode of embodiment of the present invention.

First, as shown in FIG. 17, the mask 3 typically composed of a silicon oxide film is formed on the P-type semiconductor substrate 1, so as to cover at least a portion of a target region for formation of the P-type body region 10, and an N-type impurity such as As is implanted by ion implantation process to thereby form the N-type, heavily-doped buried layers 2a. In the method of fabrication according to this mode of embodiment, there is no need of embedding P as described in the mode of first embodiment, because the N-type epitaxial layer is formed directly on the N-type, heavily-doped buried layers 2a, wherein absence of the annealing process cannot achieve the spreading of the N-type impurity as shown in the first embodiment. The mask 3 in this mode of embodiment is therefore reduced in size so as to narrow the width of region having no N-type, heavily-doped buried layers 2a formed therein, and so that the N-type, heavily-doped buried layers 2a can be connected by the diffused regions 2b in the later process.

Figure 18:
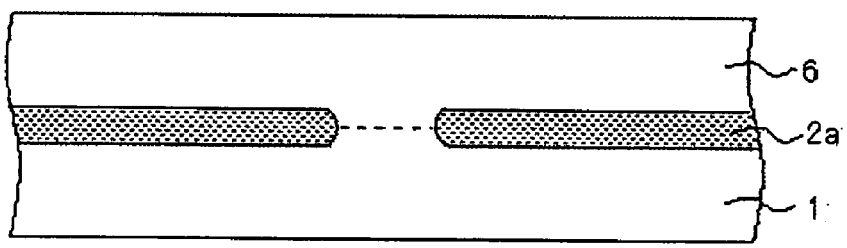
FIG. 18 is a sectional view showing a process step of the method of fabricating the DMOSFET according to the second mode of embodiment of the present invention.

Then, as shown in FIG. 18, an N-type epitaxial layer 6 (corresponded to a drain region 7 described later) of approximately 6 to 10 μm thick is formed by the CVD process at a temperature of 1,100 to 1,150 degrees centigrade or around. Also in this mode of embodiment, the effects of reducing the out-diffusion and auto-doping can be obtained because the area of formation of the N-type, heavily-doped buried layers 2a is smaller than that in the conventional structure.

Figure 19:
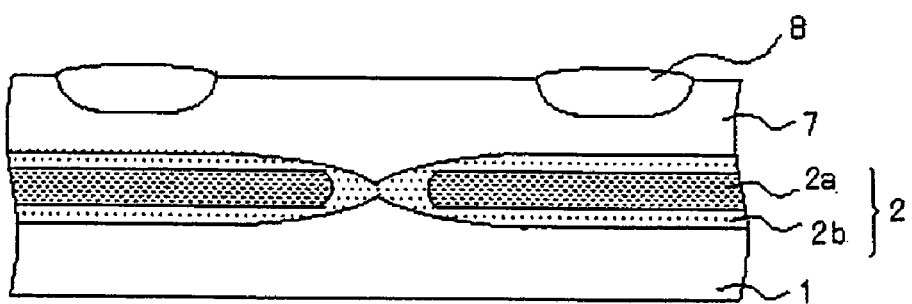
FIG. 19 is a sectional view showing a process step of the method of fabricating the DMOSFET according to the second mode of embodiment of the present invention.
Figure 20:
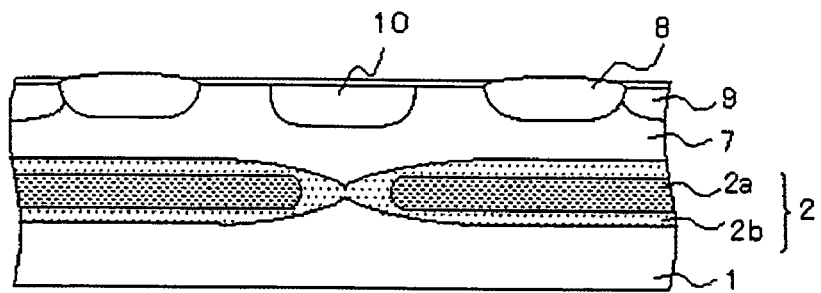
FIG. 20 is a sectional view showing a process step of the method of fabricating the DMOSFET according to the second mode of embodiment of the present invention.

Annealing for allowing diffusion of the N-type impurity contained in the N-type, heavily-doped buried layers 2a is carried out, if necessary, to thereby form the diffused regions 2b as shown in FIG. 19, and thermal oxidation is then carried out typically by the LOCOS process, typically under a temperature condition of 1,000 to 1,200° C. or around, to thereby form the field oxide film 8 of approximately 0.3 to 0.5 μm thick. The region of the N-type epitaxial layer having the field oxide film 8 formed therein will be referred to as drain region, hereinafter. The N-type, heavily-doped buried layers 2a and the diffused region 2b compose the N-type buried layer 2.

Figure 21:
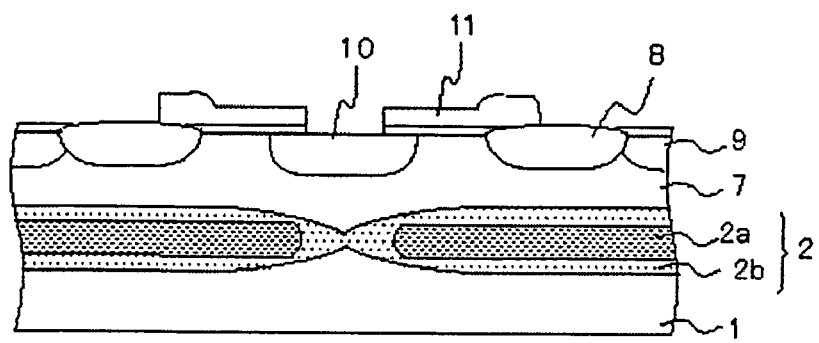
FIG. 21 is a sectional view showing a process step of the method of fabricating the DMOSFET according to the second mode of embodiment of the present invention.
Figure 22:
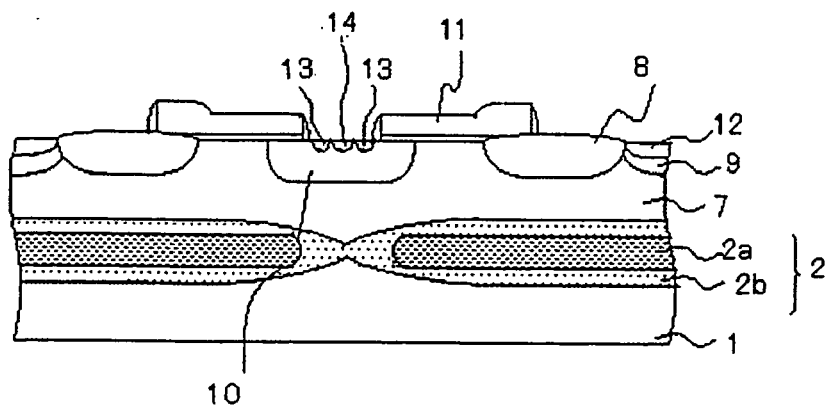
FIG. 22 is a sectional view showing a process step of the method of fabricating the DMOSFET according to the second mode of embodiment of the present invention.
Figure 23:
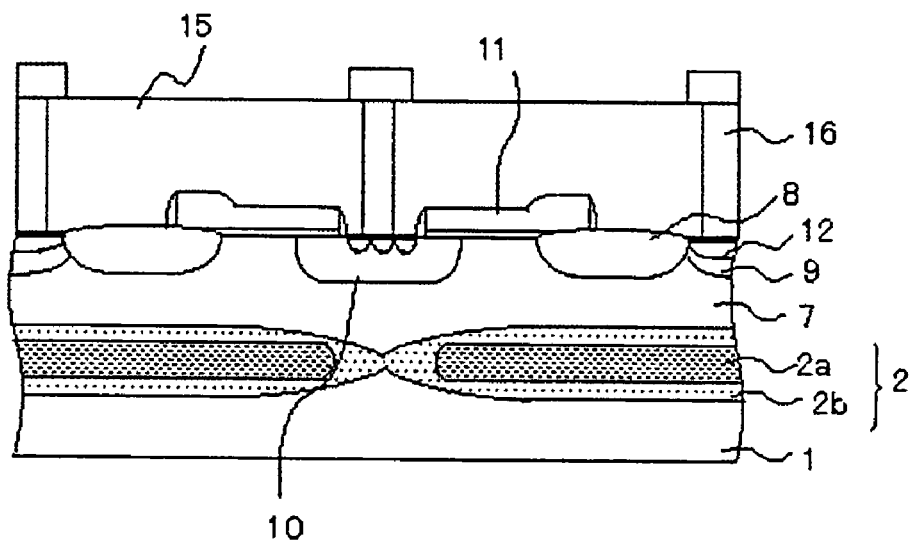
FIG. 23 is a sectional view showing a process step of the method of fabricating the DMOSFET according to the second mode of embodiment of the present invention.

Thereafter, similarly to as described in the first embodiment, a P-type impurity such as B is implanted by ion implantation process to thereby form the P-type body region 10, an N-type impurity such as P is implanted to thereby form the drain extraction region 9 (see FIG. 20), and the gate electrode 11 is formed while placing the gate insulating film thereunder (see FIG. 21). The sidewalls are formed on both side faces of the gate electrode 11, and an N-type impurity such as As is implanted by the ion implantation process to thereby form the N-type source region 13 in the P-type body region 10, and at the same time to thereby form the drain contact layer 12 in the drain extraction region 9. A P-type impurity such as $BF_2$ is implanted to thereby form the $P^+$-type region 14 as being positioned between the N-type source regions 13 at the section (see FIG. 22). Thereafter, the interlayer insulating film 15 is deposited thereon, and via-holes are then formed by a publicly-known method so as to penetrate the interlayer insulating film 15, and so as to be opened on the N-type source region 13, drain contact layer 12 and gate electrode 11. The via-holes are then filled with a metal to thereby form via-plugs 16, and the interconnects are then formed, to thereby complete a basic structure of the DMOSFET of this mode of embodiment.

Also the DMOSFET fabricated by the above-described method can successfully reduce the drain resistance as compared with the aforementioned first conventional structure having no N-type buried layer 2 formed therein, and also can suppress reduction in the drain voltage resistance as compared with the aforementioned second conventional structure having the N-type buried layer 2 formed over the entire surface. It is also made possible to simplify the fabrication process in the method of fabrication of this mode of embodiment, because there is no need of carrying out the processes of ion implantation or embedding of the ion into the P-type epitaxial layer 4.

In all of the above-described embodiments, the N-type, heavily-doped buried layers 2a are formed, the N-type impurity was diffused therefrom by annealing so as to form the diffused regions 2b, by which the N-type, heavily-doped buried layers 2a are connected with the diffused regions 2b, wherein it is not always necessary to isolate the P-type body region 10 from the P-type semiconductor substrate by the N-type buried layer 2 for the case where the semiconductor device is used while adjusting the potential of the P-type body region 10 to 0 V (substrate potential), and instead, it is also allowable to adopt a structure in which the N-type buried layers 2 are disconnected in the region under the P-type body region 10 (see FIG. 24). It is also to be noted that, in all of the above-described embodiments, the N-type buried layer 2 was composed of the N-type, heavily-doped buried layers 2a preliminarily formed and the diffused regions 2b formed by diffusing the impurity therefrom, wherein it is also allowable to form an N-type buried layer having an impurity concentration lower than that of the N-type, heavily-doped buried layer 2a between the N-type, heavily-doped buried layers 2a. In this case, a possible process of fabrication is such as forming the N-type, heavily-doped buried layers 2a in the process step shown in FIG. 4 or FIG. 17, removing the mask 3 (or forming another mask, in place of the mask 3, so as to cover the heavily-doped buried layers 2a), and then implanting the N-type impurity to a low concentration.

Further, in the above embodiments, it is illustrated as the first-conductive-type corresponds to N-type, and the second-conductive-type corresponds to P-type. However, it is also applicable that a first-conductive-type is P-type, and that a second-conductive-type is N-type.

The foregoing individual embodiments described structures of the DMOSFET as a single device and methods of fabricating the same, wherein the present invention is by no means limited to the above-described structures and methods of fabricating the same of the aforementioned embodiments, and are similarly applicable to the structure in which the DMOSFET of the present invention and other semiconductor devices are hybridized, or to the case where these devices are fabricated at the same time.

What is claimed is:

1. A double-diffused MOSFET comprising at least:
   a first-conductive-type buried layer formed in a second-conductive-type semiconductor substrate;
   a drain region composed of an epitaxial layer formed on said first-conductive-type buried layer;
   a second-conductive-type body region formed in said drain region;
   a first-conductive-type drain extraction region formed in said drain region;
   a first-conductive-type source region formed in said second-conductive-type body region;
   a gate electrode formed at least on a part of the region between said first-conductive-type source region and said first-conductive-type drain extraction region; and a drift region between said second-conductive-type body region and said first-conductive-type drain extraction region;

wherein said first-conductive-type buried layer is formed so as to have a first-conductive-type impurity concentration thereof lower in the region under said second-conductive-type body region than in the region under said drift region.

2. The double-diffused MOSFET according to claim 1, wherein said first-conductive-type buried layer further comprises first-conductive-type, heavily-doped buried layers formed in portions of said second-conductive-type semiconductor substrate before growth of said epitaxial layer, and diffused regions formed by allowing an impurity from said first-conductive-type, heavily-doped buried layers, and having an impurity concentration lower than that of said first-conductive-type, heavily-doped buried layers, and at least a part of the region under the second-conductive-type body region has only said diffused regions formed therein.

3. The double-diffused MOSFET according to claim 2, wherein said first-conductive-type, heavily-doped buried layers are connected by said diffused regions in the region under said second-conductive-type body region.

4. The double-diffused MOSFET according to claim 2, wherein said diffused regions are isolated, in the region under said second-conductive-type body region, by a region having an impurity concentration further lower than that of said diffused regions.

5. A semiconductor device comprising:
a semiconductor substrate of a second conductivity type;
a semiconductor layer of a first conductivity type on said semiconductor substrate, said semiconductor layer having first and second portions;
a buried layer of said first conductivity type between said semiconductor substrate and said first portion of said semiconductor layer, said buried layer not extending between said semiconductor substrate and said second portion of said semiconductor layer;
a body region of said second conductivity type in said second portion of said semiconductor layer;
a source region of said first conductivity type in said body region;
a drain extraction region of said first conductivity type in said first portion of said semiconductor layer; and
a gate electrode over a part of said body region between said source region and said drain extraction region.

6. The semiconductor device according to claim 5, wherein said buried layer, said drain extraction region and said gate electrode extend beyond both sides of said body region.

7. The semiconductor device according to claim 6, further comprising a diffused region of said first conductivity type surrounding said buried layer, said diffused region having an impurity concentration lower than that of said buried layer and extending at least in part between said semiconductor substrate and said second portion of said semiconductor layer.

8. The semiconductor device according to claim 7, wherein said diffused regions on both sides of said body region are connected under said body region.

9. The semiconductor device according to claim 7, wherein said diffused regions on both sides of said body region are isolated from each other under said body region.

* * * * *